(12) United States Patent
Atrash et al.

(10) Patent No.: US 7,982,492 B2
(45) Date of Patent: Jul. 19, 2011

(54) ADAPTIVE TERMINATION

(75) Inventors: Amer Atrash, Dallas, TX (US); Ross Teggatz, McKinney, TX (US); Brett Smith, McKinney, TX (US); Wayne Chen, Plano, TX (US)

(73) Assignee: Triune Systems, LP, Richardson, TX (US)

( * ) Notice: Subject to any disclaimer, the term of this patent is extended or adjusted under 35 U.S.C. 154(b) by 0 days.

(21) Appl. No.: 12/813,180

(22) Filed: Jun. 10, 2010

(65) Prior Publication Data

US 2010/0315121 A1    Dec. 16, 2010

Related U.S. Application Data

(60) Provisional application No. 61/186,832, filed on Jun. 13, 2009.

(51) Int. Cl.
*H03K 17/16*    (2006.01)
*H03K 19/003*   (2006.01)
*H04B 1/18*     (2006.01)

(52) U.S. Cl. .......................................... 326/30; 455/280

(58) Field of Classification Search .................... 326/30; 320/108; 307/104; 455/280, 269
See application file for complete search history.

(56) References Cited

U.S. PATENT DOCUMENTS

| 7,738,850 B2 * | 6/2010 | Byun ........................ 455/280 |
| 2007/0207753 A1 * | 9/2007 | Byun ........................ 455/193.1 |

* cited by examiner

*Primary Examiner* — Daniel D Chang
(74) *Attorney, Agent, or Firm* — Jackson Walker, L.L.P.; Christopher J. Rourk

(57) ABSTRACT

A system for receiving data is provided. The system includes an inductive data device, such as a device that receives high-speed data over an inductive coupling. An adjustable impedance is coupled to the inductive data device, where the adjustable impedance is used for dynamically controlling ringing in the inductive data device, such as by damping ringing signals generated by circuit inductances or capacitances.

29 Claims, 4 Drawing Sheets

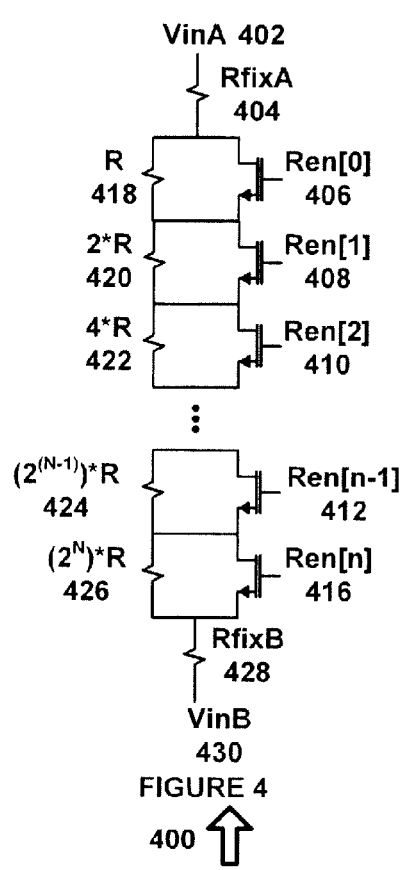
FIGURE 4
400
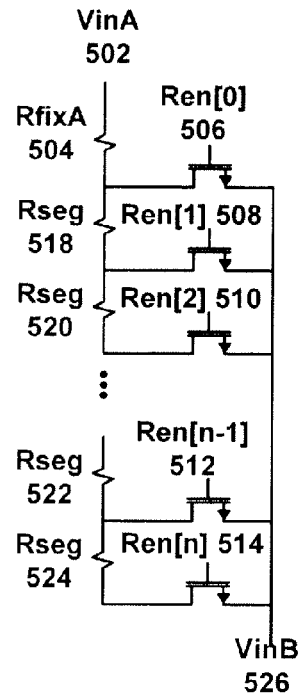
FIGURE 5
500
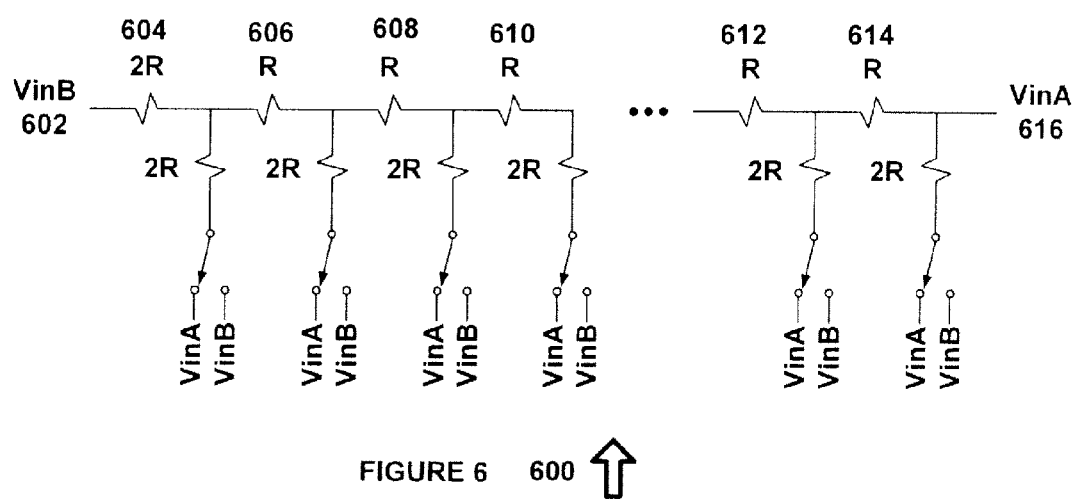
FIGURE 6    600

ADAPTIVE TERMINATION

RELATED APPLICATIONS

This application claims priority to U.S. Provisional Application Ser. No. 61/186,832, entitled "ADAPTIVE TERMINATION," filed Jun. 13, 2009, which is hereby incorporated by reference for all purposes.

FIELD OF THE INVENTION

The invention relates to inductive data transfer, and more particularly to an adaptive termination to reduce ringing in a system utilizing inductive data transfer.

BACKGROUND OF THE INVENTION

High speed wireless data transfer can be accomplished using coupled inductors. Driving coupled inductors at high speeds creates several challenges, a significant one being ringing on the secondary or receiver side. Excessive ringing can cause erroneous data or restrict the maximum system bandwidth.

SUMMARY OF THE INVENTION

A system for receiving data is provided. In one exemplary embodiment, the system includes an inductive data device, such as a device that receives high-speed data over an inductive coupling. An adjustable impedance is coupled to the inductive data device, where the adjustable impedance is used for dynamically controlling ringing in the inductive data device, such as by damping ringing signals generated by circuit inductances or capacitances.

BRIEF DESCRIPTION OF THE SEVERAL VIEWS OF THE DRAWINGS

FIG. 4 is a diagram of a system for providing a variable resistance for use in an inductive data transfer system in accordance with an exemplary embodiment of the present invention;

FIG. 5 is a diagram of system for providing an adjustable resistance in accordance with an exemplary embodiment of the present invention;

FIG. 6 is a diagram of a system for providing a variable resistance in accordance with an exemplary embodiment of the present invention;

DETAILED DESCRIPTION OF PREFERRED EMBODIMENTS

Figure 1:
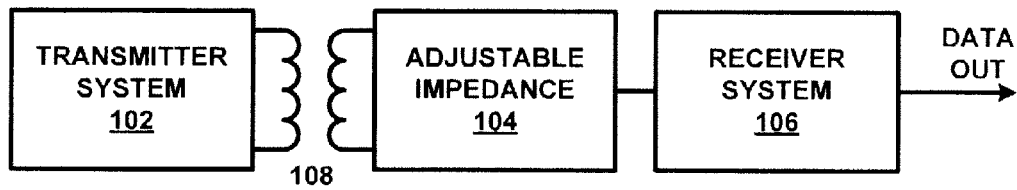
FIG. 1 is a diagram of a system for wireless inductive data transmission in accordance with an exemplary embodiment of the present invention.

In the description that follows, like parts are marked throughout the specification and drawings with the same reference numerals, respectively. The drawing figures might not be to scale and certain components can be shown in generalized or schematic form and identified by commercial designations in the interest of clarity and conciseness.

FIG. 1 is a diagram of a system 100 for wireless inductive data transmission in accordance with an exemplary embodiment of the present invention. System 100 allows inductive data transfer to be optimized by correcting ringing in the received data signal by using an adjustable impedance.

System 100 includes transmitter system 102. Transmitter system 102 can be a data transmission device such as a cellular telephone, a computing device, a computer peripheral, a meter, a device that utilizes wireless telemetry such as a vending machine, a camera, a portable storage device such as USB drive or external/removable hard drive, a calculator or other suitable devices that have inductive data transfer capability.

Adjustable impedance 104 is coupled to transmitter system 102 via inductive coupling 108. In one exemplary embodiment, inductive coupling 108 can include additional inductances in transmitter system 102 and adjustable impedance 104 or receiver system 106, or other suitable systems or components that are used to provide data transfer functionality without the need for a physical or direct connection (such as a wire line connection through a conductor) between transmitter system 102 and adjustable impedance 104 or receiver system 106. In one exemplary embodiment, adjustable impedance 104 can provide resistive damping to dissipate energy contained in or generated by circuit resonances, reflected signals or other signals that can create ringing and that otherwise obscure the inductively transmitted data signals. Impedance 104 can also or alternatively be used to provide reactive impedances, such as to de-tune a resonant circuit or for other suitable purposes, where the circuit design is amenable to the use of reactive impedances.

Receiver system 106 is coupled to adjustable impedance 104 and receives data from transmitter system 102. In one exemplary embodiment, receiver system 106 can provide feedback to adjustable impedance 104 to adjust the amount of impedance when ringing is present. Receiver system 106 outputs data that is received from transmitter system 102 across inductive coupling 108.

In operation, system 100 allows data to be inductively transmitted from transmitter system 102 to receiver system 106, and adjusts for ringing that may occur as a result of the various impedances involved in the inductive data coupling. Adjustable impedance 104 allows the ringing to be compensated, such as by detecting and correcting ringing at adjustable impedance 104, by receiving an impedance control signal from receiver system 106, or in other suitable manners.

In one exemplary embodiment, by monitoring the input to the receiver for errors in the data stream (which can be used to indicate ringing), system 100 can automatically adjust the impedance to compensate for excessive ringing. In this exemplary embodiment, the resistance value can be changed using a resistor digital to analog converter (DAC) circuit. If it is determined that the received data contains errors, such as by using cyclic redundancy checking algorithms (CRC), checksum algorithms, parity checking algorithms, error correction code algorithms (ECC), analog or digital oversampling or other suitable error detection algorithms or techniques that are known to one of skill, then the value of the DAC can be adjusted. The direction of the adjustment can be selected according to a search algorithm, arbitrarily chosen, or otherwise varied, and the received data is then checked again for error to see if the error was improved or made worse, thereby determining whether the direction was correct or not, and providing information for the next adjustment.

The amount of resistance that is required to damp any ringing of the received data signal without causing unacceptable signal attenuation is a function of the external circuit components such as the inductances and air gaps, as well as the parasitic capacitance at the receiver. The optimum resistance may vary over time due to temperature, component value variations, inductor alignment, or other effects. System 100 dynamically adjusts the impedance value to provide optimum performance.

The advantages of system 100 include a simplified system architecture, no need for an external resistance, a receiver impedance that is determined automatically by the adaptive control, a robustness to temperature and system variation, automatic recalibration that compensates for changes over time, and reduced ringing.

Figure 2:
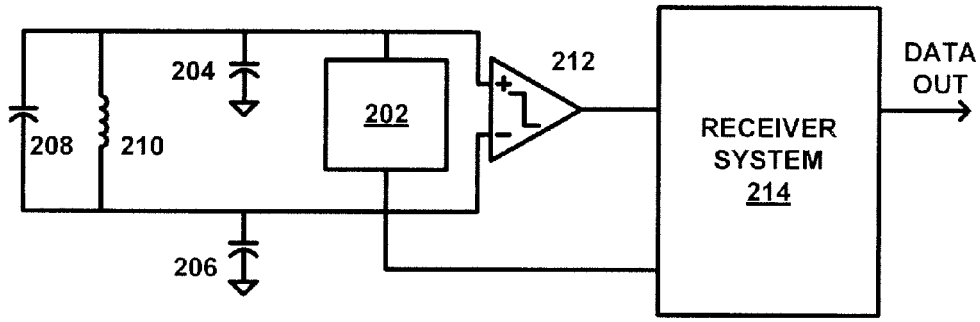
FIG. 2 is a diagram of a system for receiving data over an inductive coupling in accordance with an exemplary embodiment of the present invention.

FIG. 2 is a diagram of a system 200 for receiving data over an inductive coupling in accordance with an exemplary embodiment of the present invention. System 200 includes adjustable impedance 202, which is coupled to differential amplifier 212, receiver system 214, capacitor 204, capacitor 206, capacitor 208, and inductor 210. In one exemplary embodiment, adjustable impedance 202 can detect ringing generated by data signals received through an inductive coupling with inductor 210, such as by using an internal ring detector, and can damp the ringing by adjusting a variable impedance by an amount that is large enough to reduce the ringing but which does not adversely affect the received signal. In this manner, the signal provided to differential amplifier 212 can be processed to avoid ringing.

In another exemplary embodiment, receiver, system 214 can receive the signal generated by differential amplifier 212, and can provide feedback to adjustable impedance 202 when ringing is present. In this exemplary embodiment, the transmitter system can continue to retransmit the data until ringing has been eliminated, such as by using a handshaking procedure in which the transmitter continues to transmit a data packet to the receiver until the receiver returns a confirmation packet, by transmitting a request from the receiver to the transmitter for retransmission of a data packet until the data packet is received without any errors, or in other suitable manners. Although adjustable impedance 202 is shown in parallel with inductor 210, it can also be in series or otherwise provided as suitable to reduce ringing.

Inductor 210 can be a system inductance that has a variable value based on the air gap or other parameters of the inductive coupling to the transmitter system. Capacitors 208, 204 and 206 can be design capacitances, stray capacitances, or other capacitances that may be present in system 200 and which may affect the ability of system 200 to receive data without generating ringing. Although capacitor 208 is shown in parallel with inductor 210, it can alternatively be in series, and other exemplary circuit impedances can be arranged in series or parallel as may typically occur.

In operation, system 200 utilizes an adjustable impedance 202 to compensate for circuit impedances in the receiver of an inductive receiver coupling. System 200 thus allows data transfer across an inductive coupling to be performed with improved efficiency and decreased ringing.

Figure 3:
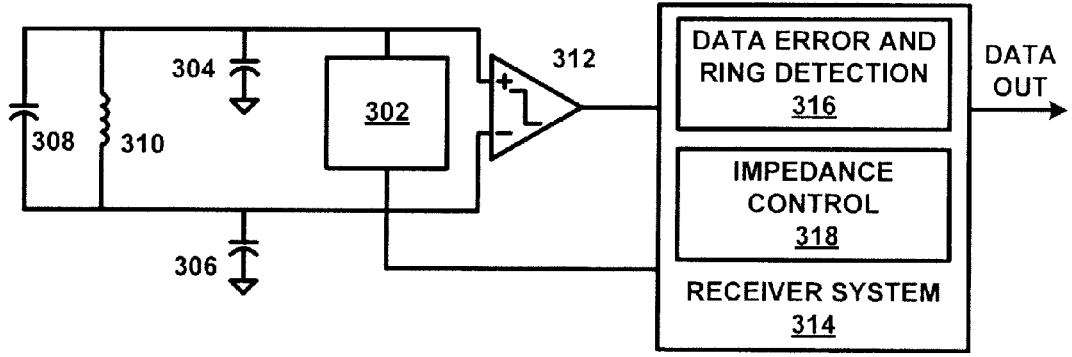
FIG. 3 is a diagram of a system for eliminating ringing in an inductive data coupling in accordance with an exemplary embodiment of the present invention.

FIG. 3 is a diagram of a system 300 for eliminating ringing in an inductive data coupling in accordance with an exemplary embodiment of the present invention. System 300 includes adjustable impedance 302, data error and ring detection circuit 316, capacitors 304, 306 and 308, inductor 310, differential amplifier 312, receiver system 314 and impedance control 318, where data error and ring detection circuit 316 and impedance control 318 can be implemented as one or more algorithms operating on a digital signal processor, as a field programmable gate array, as an application-specific integrated circuit, as a combination of discrete digital or analog devices, or in other suitable manners.

Inductor 310 and capacitor 308 are parts of an inductive data coupling to a transmitter system. Capacitors 304 and 306 can be stray capacitance or other suitable capacitances that may be provided for various design purposes in system 300. When data is transmitted across an air gap to inductor 310, a ringing signal can be generated from resonance of parasitic or stray capacitances and inductances, signal frequency components, or other system parameters. In this exemplary embodiment, adjustable impedance 302 can be used to damp the ringing or otherwise improve the ability of data to be transferred across the inductive coupling.

Differential amplifier 312 generates a signal based on the received data signal and any ringing signal that may be present. The signal generated by differential amplifier 312 is provided to receiver system 314, which can include data error and ring detection circuit 316 and impedance control 318. Data error and ring detection circuit 316 can detect a ring signal in the output of differential amplifier 312, such as by using conventional error detection processes (e.g. ECC and parity check) or in other suitable manners. If data error and ring detection circuit 316 determines that ringing is present, control data is provided to impedance control 318 which determines a control signal or generates a control signal for adjustable impedance 302. In one exemplary embodiment, adjustable impedance 302 can include a predetermined number of resistances, where the amount of resistance is increased from a minimum value until ringing is compensated. In this exemplary embodiment, impedance control 318 can include a state machine and can vary the control settings for the adjustable impedance 302 until ringing has been eliminated. Typically, ringing can be damped by an added resistance, which will also cause attenuation of the received signal. Thus, when the ringing has been adequately compensated for, additional resistance only causes a detrimental impact on the received signal. Impedance control 318 can thus increase or decrease the amount of damping resistance in response to a control signal generated by data error and ring detection circuit 316, such as to reduce the damping resistance if the attenuation in the received signal is unacceptable.

In operation, system 300 allows improved efficiency of data transfer across and inductive data coupling by damping ringing and by removing damping when ringing is not present. System 300 thus eliminates data errors, improves data efficiency, and otherwise facilitates inductive data transfer.

FIG. 4 is a diagram of a system 400 for providing variable resistance for use in an adjustable impedance in an inductive data transfer system in accordance with an exemplary embodiment of the present invention.

System 400 includes differential voltages Vin A 402 and Vin B 430, fixed resistance 404 and fixed resistance 428 (either or both of which can be omitted where suitable). Fixed resistance 404 and fixed resistance 428 are used to provide a minimum resistance value. In addition, system 400 includes a plurality of switches Ren[0] 406 through Ren[n] 416 and a plurality of resistance R 418 through $2^N*R$ 426. In this exemplary embodiment, an adjustable amount of impedance or resistance can be provided by turning switches 406 through 416 on or off, such as by turning switch 406 on to conduct energy and bypass resistance 418 while the remainder of switches 408 through 416 are off, so as to provide a resistance equal to the sum of 2*R 420 through $2^N$*R 426. Likewise, other suitable configurations can be used.

In operation, system 400 provides a variable resistance for use in a ringing control circuit. System 400 is configured similar to a digital to analog converter ladder circuit, but uses the variable resistance values for attenuation of ringing instead of conversion from a digital to an analog value.

FIG. 5 is a diagram of system 500 for providing an adjustable resistance in accordance with an exemplary embodiment of the present invention. As shown in FIG. 5, the difference between voltages Vin A 502 and Vin B 526 is imposed across the adjustable resistance circuit. A plurality of switches Ren [0] 506 through Ren[N] 514 are used to controllably switch a plurality of resistances RSEG 518 through RSEG 524. addition, a fixed resistance Rfix A 504 provides a minimum available resistance.

In operation, system 500 provides a different adjustable resistance configuration and architecture for use in a ringing control circuit. Control signals generated by an impedance controller are used to set the switch configuration of system in response to a ring detection signal, state information and other suitable data and signals to provide an impedance value that reduces ringing without adversely affecting attenuation of the received data signal.

FIG. 6 is a diagram of a system 600 for providing a variable resistance in accordance with an exemplary embodiment of the present invention. As shown in FIG. 6, which is commonly referred to as an R2R configuration, a plurality of impedance and switching stages 604 through 616 are provided in which a resistance value 2*R is connected in series with a resistance value 2*R that is then coupled in series to a switch that can alternately connect to Vin A 616 and Vin B 602, so as to couple resistances in controllable combinations between voltages Vin A 616 and Vin B 602. The connections to the switches allow a large number of different parallel and series resistance combinations to be formed so as to facilitate a large number of potential resistance settings.

In operation, system 600 allows a resistance value to be generated for an adjustable impedance in a ringing control circuit. Control signals generated by an impedance controller in response to ring detection signals, state information and other suitable data and signals are used to set the switch configuration of system to provide an impedance value that reduces ringing without adversely affecting attenuation of the received data signal.

Figure 7:
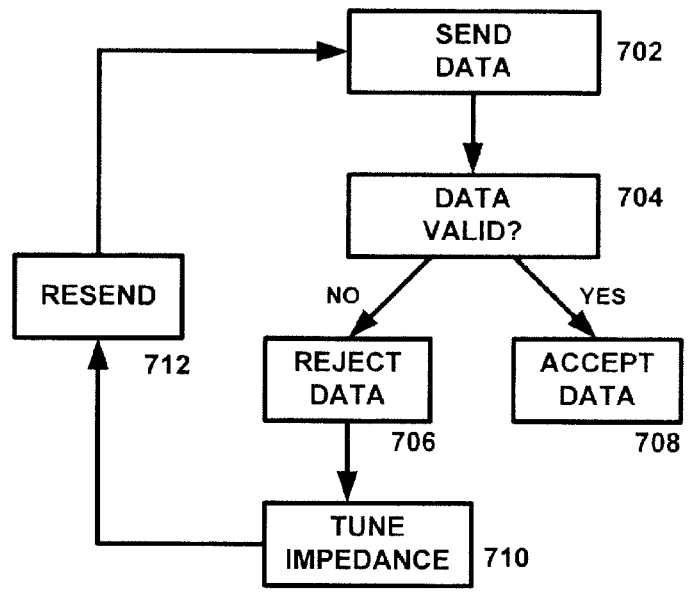
FIG. 7 is a diagram of an algorithm for controlling an adjustable impedance in accordance with an exemplary embodiment of the present invention.

FIG. 7 is a diagram of an algorithm 700 for controlling an adjustable impedance in accordance with an exemplary embodiment of the present invention. Algorithm 700 can be implemented using a field programmable gate array, as code operating on a digital signal processing platform or in other suitable manners.

Algorithm 700 begins at 702 where data is received in a receiver. The algorithm then proceeds to 704 where it is determined whether the received data is valid. In one exemplary embodiment, an error correction code, parity check or other suitable error detection procedure can be used to determine whether there are errors present in the data. If it is determined that the data is valid, the algorithm then proceeds to 708. Otherwise, the algorithm proceeds to 706.

At 706, the data is rejected, such as by changing a state variable that represents the state of the received data or in other suitable manners. The algorithm proceeds to 710 where the impedance in an adjustable impedance in a ring control circuit is tuned. In one exemplary embodiment, the tuning of the impedance at 710 can include making one or more changes to an impedance setting of an adjustable impedance, such as by using a search algorithm to increase or decrease the impedance by a predetermined amount and to determine whether the ringing has been compensated for. The algorithm then proceeds to 712 where data is retransmitted. In one exemplary embodiment, the data is retransmitted according to a time-out protocol, in response to a request from the receiver, or in other suitable manners. The algorithm then proceeds to 702.

In operation, algorithm 700 automatically adjusts an impedance to control ringing in an inductively coupled data transmission system receiver circuit. Algorithm 700 allows the amount of impedance to be set based on the existing circuit parameters at the time that ringing is detected.

Figure 8:
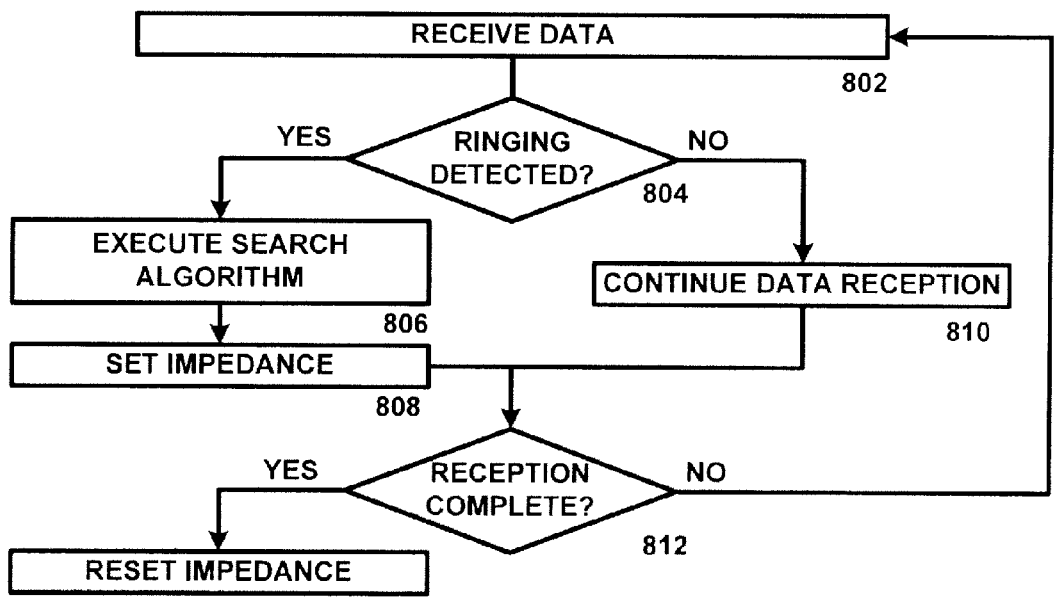
FIG. 8 is a diagram of an algorithm for controlling ringing in accordance with an exemplary embodiment of the present invention.

FIG. 8 is a diagram of an algorithm 800 for controlling ringing in accordance with an exemplary embodiment of the present invention. Algorithm 800 can be implemented using a field programmable gate array, as code operating on a digital signal processing platform or in other suitable manners.

Algorithm 800 begins at 802 where data is received from a transmitter across an inductive data coupling. The algorithm then proceeds to 804, where it is determined whether ringing has been detected. In one exemplary embodiment, ringing can be detected at an adjustable impedance circuit, by performing error detection, or in other suitable manners. If it is determined at 804 that ringing has not been detected, the algorithm proceeds to 812 where data reception continues. Otherwise, the algorithm proceeds to 806.

At 806, a search algorithm is executed. In one exemplary embodiment, the search algorithm can step through a number of impedance settings so as to identify the optimal impedance setting. In this exemplary embodiment, the search algorithm can start at the lowest available impedance and can increase the impedance by predetermined steps until ringing has decreased. Likewise, other suitable search processes can be used, such as by increasing the step size until ringing has decreased and then reversing the steps until ringing starts to increase or in other suitable manners. The algorithm then proceeds to 808 where the impedance is set. The algorithm then proceeds to 812.

At 812, it is determined whether the reception has been completed. If reception has not been completed the algorithm returns to 802, otherwise, the algorithm proceeds to 814 where the ringing control impedance is reset. In this exemplary embodiment, resetting the ringing control impedance to the lowest possible value ensures that the ringing control impedance will not interfere with data reception under subsequent circumstances or circuit configurations where ringing is not an issue.

Likewise, the impedance can be periodically reset and recalibrated, such as to prevent excessive attenuation of the received data signal. In this exemplary embodiment, it can also or alternatively be determined at 812 whether a predetermined period of time has elapsed, based on the operating environment of the inductive data receiver. For example, where the inductive data receiver is locked into a data transmission apparatus, then it may only be necessary to reset and recalibrate the impedance whenever the inductive data receiver is removed and returned to a docking station having a lock or other suitable device. In another exemplary embodiment, where the inductive data receiver is held in place manually, changes in an air gap, position or other variables may require more frequent recalibration.

In operation, algorithm 800 allows an inductive data receiver with an adjustable impedance to be automatically controlled to reduce ringing without causing excessive attenuation of the received signal. In one exemplary embodiment, "excessive" attenuation can be attenuation where the received signal is too attenuated to be processed to extract encoded data.

Figure 9:
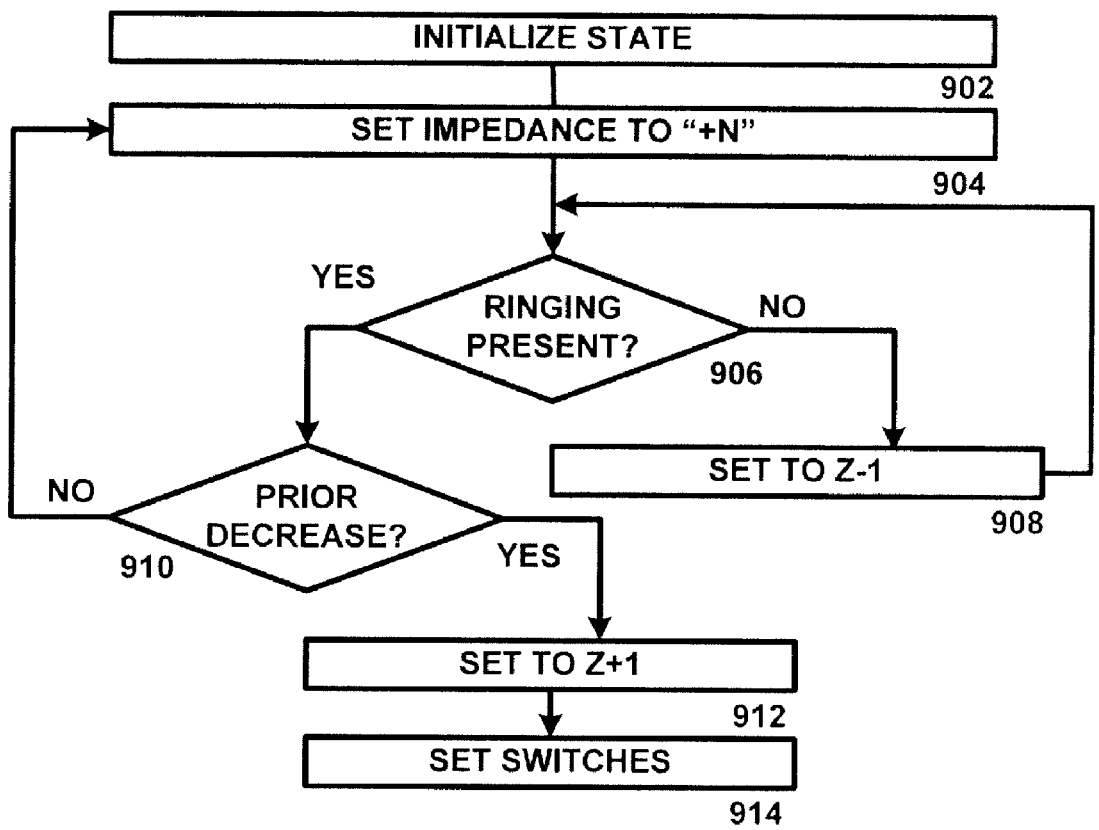
FIG. 9 is a diagram of an algorithm for changing ring-damping impedance in accordance with an exemplary embodiment of the present invention.

FIG. 9 is a diagram of an algorithm 900 for changing a ring-damping impedance in accordance with an exemplary embodiment of the present invention. Algorithm 900 can be implemented using a field programmable gate array, as code operating on a digital signal processing platform or in other suitable manners, and can be used to control a variable impedance circuit having an impedance value that is controlled using a plurality of switches, such as one of the exemplary variable impedance circuits shown in FIGS. 4 through 6, or using other suitable circuits.

Algorithm 900 begins at 902, where a state of a variable impedance is initialized. In one exemplary embodiment, the variable impedance will include state variables that indicate whether the impedance has previously been increased or decreased. The algorithm then proceeds to 904.

At 904, the impedance is increased by a predetermined number of steps "N," where N is greater than one. In one exemplary embodiment, the configuration of a variable impedance can be used to create a table of impedance values to allow the impedance to be increased or decreased in equal steps or in groups of steps. In this exemplary embodiment, the impedance can be increased by a predetermined group of steps of "N." The algorithm then proceeds to 906.

At 906, it is determined whether ringing is still present. If it is determined that ringing is not present, then the algorithm proceeds to 908 and the impedance is decreased by one setting. The algorithm then returns to 906. If it is determined at 906 that ringing is present, the algorithm proceeds to 910 where it is determined whether there was a previous decrease. In one exemplary embodiment, where the impedance is increased in a "coarse" tuning mode in steps greater than one step size, a cessation of ringing can be used to switch to a "fine" tuning mode where the impedance is subsequently decreased in single steps. In this manner, the impedance is first increased on large step sizes until ringing is eliminated, and the impedance is then decreased in single steps until ringing is again detected, at which point the impedance is set to the last impedance at which no ringing was present. If it is determined at 910 that there was no prior decrease, the algorithm returns to 904, otherwise the algorithm proceeds to 912 where the setting for the impedance is increased by one and the switches are set for signal processing.

In operation, algorithm 900 provides an exemplary search algorithm for setting switches in a variable impedance circuit. Algorithm 900 quickly identifies an optimal impedance setting to reduce ringing without over-damping the received signal, which can cause undesired signal attenuation.

While certain exemplary embodiments have been described in detail and shown in the accompanying drawings, it is to be understood that such embodiments are merely illustrative of and not restrictive on the broad invention. It will thus be recognized to those skilled in the art that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and the spirit of the invention defined by the appended claims.

What is claimed is:

1. A system for receiving data comprising:
    an inductive data device;
    an adjustable impedance coupled to the inductive data device, the adjustable impedance for dynamically controlling ringing in the inductive data device;
    a receiver coupled to the inductive data device, wherein the receiver is configured to receive a data signal and generate a control signal for the adjustable impedance in response to the data signal, wherein the receiver further comprises a ring detector for determining whether ringing is present in the data signal.

2. The system of claim 1 wherein the ring detector further comprises an error detector for determining whether a data error is present in the data signal.

3. The system of claim 2 wherein the error detector is configured to perform one or more of an error correction code algorithm, a cyclic redundancy check algorithm, a checksum algorithm or a parity check algorithm.

4. The system of claim 1 further comprising an impedance controller for setting an impedance value of the adjustable impedance.

5. The system of claim 4 wherein the impedance controller is configured to increase and decrease the adjustable impedance based on an algorithm so as to optimize the impedance value of the adjustable impedance to reduce ringing without excessive attenuation of a received signal.

6. The system of claim 4 wherein the impedance controller is configured to periodically determine whether ringing is present in a received data signal and to adjust the impedance value of the adjustable impedance to reduce the ringing.

7. The system of claim 4 wherein the impedance controller is configured to periodically determine whether ringing is present in a received data signal and to adjust the impedance value of the adjustable impedance to reduce attenuation of the received data signal.

8. The system of claim 1 wherein the inductive data device comprises one of a cellular telephone, a computer device, a meter reading data, a computer peripheral, a camera, a portable storage device, a calculator or a telemetry device.

9. A system for receiving data comprising:
    an inductive data device, the inductive data device including a coupling inductance and a plurality of capacitances;
    an adjustable impedance coupled to the inductive data device, the adjustable impedance for controlling ringing in the inductive data device, wherein the ringing is generated by one or more of the coupling inductance and the plurality of capacitances;
    a receiver coupled to the inductive data device, wherein the receiver is configured to receive a data signal and generate a control signal for the adjustable impedance in response to the data signal;
    a ring detector for determining whether ringing is present in the data signal;
    an error detector for determining whether a data error is present in the data signal, wherein the error detector is configured to perform one or more of an error correction code algorithm, a control record check algorithm, a checksum algorithm or a parity check algorithm;
    an impedance controller for setting an impedance value of the adjustable impedance, wherein the impedance controller comprising means for increasing and decreasing the adjustable impedance to optimize the impedance value of the adjustable impedance to reduce ringing without excessive attenuation of a received signal.

10. A method for receiving data comprising:
    receiving a data signal at an inductive data device;

dynamically adjusting an impedance value of an adjustable impedance circuit coupled to the inductive data device to control ringing in the inductive data device;

generating a control signal for adjusting the adjustable impedance in response to the data signal;

determining whether ringing is present in the data signal after adjusting the adjustable impedance; and modifying the control signal if ringing present in the data signal.

11. The method of claim 10 wherein determining whether ringing is present in the data signal comprises 1) determining whether a data error is present in the data signal or 2) performing one or more of an error correction code algorithm, a cyclic redundancy check algorithm, a checksum algorithm or a parity check algorithm on the data signal.

12. The method of claim 10 further comprising decreasing the adjustable impedance to reduce ringing.

13. The method of claim 10 further comprising increasing the adjustable impedance to reduce attenuation of the data signal.

14. The method of claim 10 comprising:
periodically determining whether ringing is present in the data signal; and
adjusting the impedance value of the adjustable impedance to reduce the ringing if ringing is present.

15. The method of claim 10 comprising:
periodically determining whether ringing is present in the received data signal; and
adjusting the impedance value of the adjustable impedance to reduce attenuation of the received data signal if ringing is not present.

16. A system for receiving data comprising:
an inductive data device;
an adjustable impedance coupled to the inductive data device, the adjustable impedance for dynamically controlling ringing in the inductive data device; and
an impedance controller for setting an impedance value of the adjustable impedance, wherein the impedance controller is configured to periodically determine whether ringing is present in a received data signal and 1) to adjust the impedance value of the adjustable impedance to reduce the ringing or 2) to reduce attenuation of the received data signal.

17. The system of claim 16 further comprising a receiver coupled to the inductive data device, wherein the receiver is configured to receive a data signal and generate a control signal for the adjustable impedance in response to the data signal.

18. The system of claim 17 wherein the receiver further comprises a ring detector for determining whether ringing is present in the data signal.

19. The system of claim 18 wherein the ring detector further comprises an error detector for determining whether a data error is present in the data signal.

20. The system of claim 19 wherein the error detector is configured to perform one or more of an error correction code algorithm, a cyclic redundancy check algorithm, a checksum algorithm or a parity check algorithm.

21. The system of claim 16 wherein the impedance controller is configured to increase and decrease the adjustable impedance based on an algorithm so as to optimize the impedance value of the adjustable impedance to reduce ringing without excessive attenuation of a received signal.

22. The system of claim 16 wherein the inductive data device comprises one of a cellular telephone, a computer device, a meter reading data, a computer peripheral, a camera, a portable storage device, a calculator or a telemetry device.

23. A method for receiving data comprising:
receiving a data signal at an inductive data device;
dynamically adjusting an impedance value of an adjustable impedance circuit coupled to the inductive data device to control ringing in the inductive data device
periodically determining whether ringing is present in the data signal; and
adjusting the impedance value of the adjustable impedance 1) to reduce the ringing if ringing is present, or 2) to reduce attenuation of the received data signal if ringing is not present.

24. The method of claim 23 further comprising generating a control signal for adjusting the adjustable impedance in response to the data signal.

25. The method of claim 24 further comprising:
determining whether ringing is present in the data signal after adjusting the adjustable impedance; and
modifying the control signal if ringing present in the data signal.

26. The method of claim 25 wherein determining whether ringing is present in the data signal comprises determining whether a data error is present in the data signal.

27. The method claim 25 wherein determining whether ringing is present in the data signal comprises performing one or more of an error correction code algorithm, a cyclic redundancy check algorithm, a checksum algorithm or a parity check algorithm on the data signal.

28. The method of claim 23 further comprising decreasing the adjustable impedance to reduce ringing.

29. The method of claim 23 further comprising increasing the adjustable impedance to reduce attenuation of the data signal.

* * * * *